(12) United States Patent
Oshiro et al.

(10) Patent No.: US 7,075,311 B1
(45) Date of Patent: Jul. 11, 2006

(54) INSULATION DETECTING DEVICE FOR NON-GROUNDED POWER SOURCE

(75) Inventors: Kazutoshi Oshiro, Haibara-gun (JP); Yoshihiro Kawamura, Haibara-gun (JP); Toshihiro Sone, Wako (JP); Tadashi Shimada, Wako (JP)

(73) Assignees: Yazaki Corporation, Tokyo (JP); Honda Motor Co., Ltd., Tokyo (JP)

( * ) Notice: Subject to any disclaimer, the term of this patent is extended or adjusted under 35 U.S.C. 154(b) by 0 days.

(21) Appl. No.: 11/116,431

(22) Filed: Apr. 28, 2005

(51) Int. Cl.
*G01R 31/06* (2006.01)
(52) U.S. Cl. .................................... 324/557
(58) Field of Classification Search ............. None
See application file for complete search history.

(56) References Cited

U.S. PATENT DOCUMENTS 5,818,236 A * 10/1998 Sone et al. ............... 324/509

FOREIGN PATENT DOCUMENTS

JP          8-226950 A     9/1996

* cited by examiner

*Primary Examiner*—Vincent Q. Nguyen
(74) *Attorney, Agent, or Firm*—Sughrue Mion, PLLC

(57) ABSTRACT

An insulation detecting device having a capacitor and a DC power source, insulated from a ground potential part. A voltage detecting unit, detects a voltage across the capacitor. A first switching unit connects the capacitor to the DC power source in series for a first preset time shorter than a time taken for completely charging the capacitor. A second switching unit connects the capacitor between a positive terminal of the DC power source and the ground potential part in series for a second preset time. A third switching unit connects the capacitor between a negative terminal of the DC power source and the ground potential part in series for the second preset time. A fourth switching unit connects the voltage detecting unit to the capacitor after the first to third switching units are turned off. A computing unit estimates a voltage across the power source.

3 Claims, 5 Drawing Sheets

INSULATION DETECTING DEVICE FOR NON-GROUNDED POWER SOURCE

BACKGROUND OF THE INVENTION

The present invention relates to an insulation detecting device in use for a non-grounded power source, more particularly, to an insulation detecting device which is well adaptable for a non-grounded DC power source carried on a vehicle of the type which is driven by a propelling force electrically generated.

A related insulation detecting device in use for the non-grounded power source is disclosed in JP-A-08-226950 (pages 4–7, FIG. 1), for example. The insulation detecting device detects to a ground resistance, i.e., an insulation resistance with respect to a ground potential part of the positive and negative main circuit wirings which are connected to the positive and negative terminals of a non-grounded DC power source and insulated from a ground potential part. The insulation detecting device includes a first switching unit for connecting a capacitor to between a positive terminal of the non-grounded DC power source and a ground potential part in series for a preset time, a second switching unit for connecting the capacitor to between a negative terminal of the non-grounded DC power source and a ground potential part in series for a preset time, a third switching unit for connecting a voltage detecting unit for detecting voltage across the capacitor after the respective switching units are turned off, and a computing unit for computing an insulation resistance, i.e., a ground resistance, between the power source and the ground potential part by using the voltage across the capacitance which is detected by the voltage detecting unit after the switching units are turned off and a power source voltage previously computed in a state that the capacitor is completely charged. The insulation detecting device detects or decides an insulation state of the main circuit wirings by using the ground resistance computed by the computing unit.

To compute the ground resistance, the insulation detecting device uses a formula containing a capacitance value of the capacitor as a constant. The capacitance of the capacitor varies in value among capacitor products and when temperature varies. Further, the capacitance value sometimes varies due to aging of the capacitor. Where the capacitance value used as the constant varies or changes, an error of a computed ground resistance value to an actual resistance value increases. This deteriorates an accuracy of detecting an insulation state of the main circuit wirings to a ground potential part. For this reason, there is a demand of developing new techniques which are capable of minimizing the measurement error of the ground resistance and enhancing the accuracy of the insulation state detection even if there is a variation in the value of a circuit part, such as a capacitance value, which is used as a constant in the formula in computing the ground resistance.

SUMMARY OF THE INVENTION

It is therefore an object of the present invention to provide an insulation detecting device capable to enhance an accuracy of detecting an insulation state of the circuit wirings to the ground potential part.

In order to achieve the above object, according to the present invention, there is provided an insulation detecting device for a non-grounded power source, comprising:

a capacitor;

a DC power source, insulated from a ground potential part;

a voltage detecting unit, detecting a voltage across the capacitor;

a first switching unit, connecting the capacitor to the DC power source in series for a first preset time shorter than a time taken for completely charging the capacitor;

a second switching unit, connecting the capacitor between a positive terminal of the DC power source and the ground potential part in series for a second preset time;

a third switching unit, connecting the capacitor between a negative terminal of the DC power source and the ground potential part in series for the second preset time;

a fourth switching unit, connecting the voltage detecting unit to the capacitor after the first to third switching units are turned off; and a computing unit, estimating a voltage across the power source based on a detection voltage that is detected by the voltage detecting unit after the first switching unit is turned off, and computing insulation resistances of the power source to the ground potential part based on the estimated voltage and each detection voltage that is detected by the voltage detecting unit after either of the second and third switching unit is turned off.

In the above configuration, the first preset time is selected to be shorter than a time taken for completely charging the capacitor. Accordingly, during the first preset time, the capacitor is connected between the DC power source and the ground potential part by the first switching unit, and is charged. At this time, a voltage across the capacitor is detected by the voltage detecting unit connected by the fourth switching unit, and the computing unit estimates a power source voltage by using the detected voltage. The computing unit computes insulation resistances by using the estimated power source voltage and the detection voltage detected by the detecting unit after the second and third switching unit are turned off. As a result, measuring errors of the insulation resistances are reduced and an accuracy of detecting an insulation state of the circuit wires to the ground potential part.

Preferably, the first switching unit includes a first switch device connected to the positive terminal of the power source and a second switch device connected to the negative terminal of the power source. The third switching unit includes the second switch device and a third switch device connected in series to the first switch device. The second switching unit includes the first switch device and a fourth switch device connected in series to the second switch device. The fourth switching unit includes the third switch device and the fourth switch device. A first series circuit including a first diode, a first resistor and the capacitor are connected between a node between the first switch device and the third switch device and a node between the second switch device and the fourth switch device, an anode of the first diode being connected to the first switch device. A second series circuit including a second diode and a second resistor is connected in parallel to the first diode and the first resistor of the first series circuit, an anode of the second diode being connected to a node between the first resistor and the capacitor. The voltage detecting unit is connected between the third switch device and the fourth switch device. The ground potential part is connected between the voltage detecting unit and the fourth switch device.

Preferably, the insulation detecting device further comprises a by-passing unit including a fifth switch device which forms a by-passing path of the second resistor when the fifth switch is turned on.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

The preferred embodiments of the present invention will be described with reference to FIGS. 1 through 4.

Figure 1:
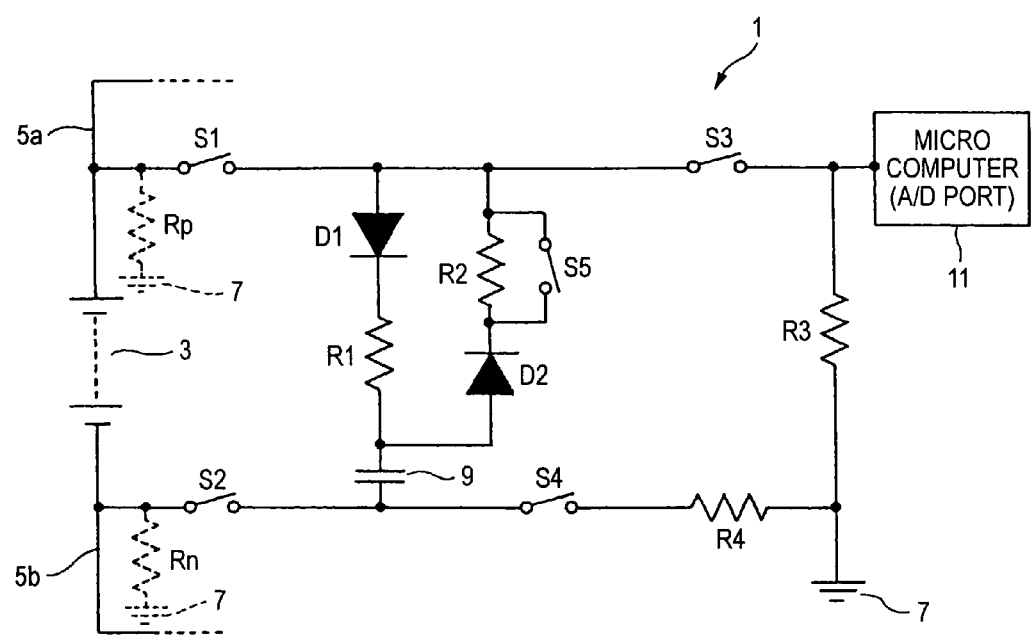
FIG. 1 is a circuit diagram showing an insulation detecting device for detecting an insulation state of a non-grounded power source to a ground potential part, which is an embodiment of the invention.

The insulation detecting device 1 according to the invention is applied to a DC power source 3, which is a power source for, for example, an electrically propelled vehicle of which the propelling force is produced by utilizing electric power, as shown in FIG. 1. The power source 3 may be a combination of storage batteries connected in series or a fuel battery. A positive main circuit wiring 5a coupled to a positive terminal of the power source 3 and a negative main circuit wiring 5b of a negative terminal thereof are insulated from a ground potential part 7, for example, a vehicle body. As a result, the power source 3 is a non-grounded power source. The insulation detecting device 1 includes a first switch S1, a second switch S2, a third switch S3, a fourth switch S4, a capacitor 9, a micro computer 11 which serves as a voltage detecting unit and a computing unit, and decides an insulating state, and a switching control circuit (not shown) for controlling switching operations of those switches according to preset times.

The detecting unit, the computing unit, the switching control circuit and the like may be separately or integrally formed. For example, the switching control circuit may be integrated into the micro computer 11. The first switch S1, the second switch S2, the third switch S3 and the fourth switch S4 are simply illustrated in model form. Actually, those switches are switch devices each formed with any of various parts having switching functions, such as a relay, a semiconductor switch or the like.

A series circuit of the first switch S1 and the second switch S2 is connected to a positive terminal of the power source 3. A series circuit of the second switch S2, the fourth switch S4, and a fourth resistor R is connected to a negative terminal of the power source 3. A first diode D1, a first resistor R1 and a capacitor 9 are series connected between a node between the first switch S1 and the third switch S3 and a node between the second switch S2 and the fourth switch S4. A series circuit including a second diode D2 and a second resistor R2 is connected between a node between the first diode D1 and the first resistor R1 and a node between the second diode D2 and the second resistor R2. A series circuit of the first diode D1 and the first resistor R1 and the series circuit of the second diode D2 and the second resistor R2 are connected in parallel. A fifth switch S5 is parallel connected to the second resistor R2. The first diode D1 permits current to flow from the positive main circuit wiring 5a side to the negative main circuit wiring 5b side, while the second diode D2 permits current to flow from the negative main circuit wiring 5b side to the positive main circuit wiring 5a side.

The third resistor R3 is inserted between the third switch S3 and the fourth resistor R4 in series. The micro computer 11 serving as both the detecting unit and the computing unit is connected to a node between the third switch S3 and a third resistor R3 through at an analog to digital conversion port, i.e., A/D port. A node between the third resistor R3 and the fourth resistor R4 is connected to the ground potential part 7.

A first switching unit for connecting the capacitor 9 to the power source 3 in series for a first preset time includes the first switch S1, the second switch S2, a switching control circuit (not shown) and others. A second switching unit for connecting the capacitor 9 to between the positive terminal of the power source 3 and the ground potential part 7 in series for a second preset time includes the first switch S1, the fourth switch S4, a switching control circuit (not shown) and others. A third switching unit for connecting the capacitor 9 to between the ground potential part 7 and the negative terminal of the power source 3 in series for the second preset time includes the second switch S2, the third switch S3, a switching control circuit and others. A fourth switching unit includes the third switch S3, the fourth switch S4, a switching control circuit and others. The capacitor 9 has a relatively high capacitance of several μF, for example. The first and the resistor R1 and R2 have each relatively high resistance of several hundreds k Ω, for example.

Figure 2:
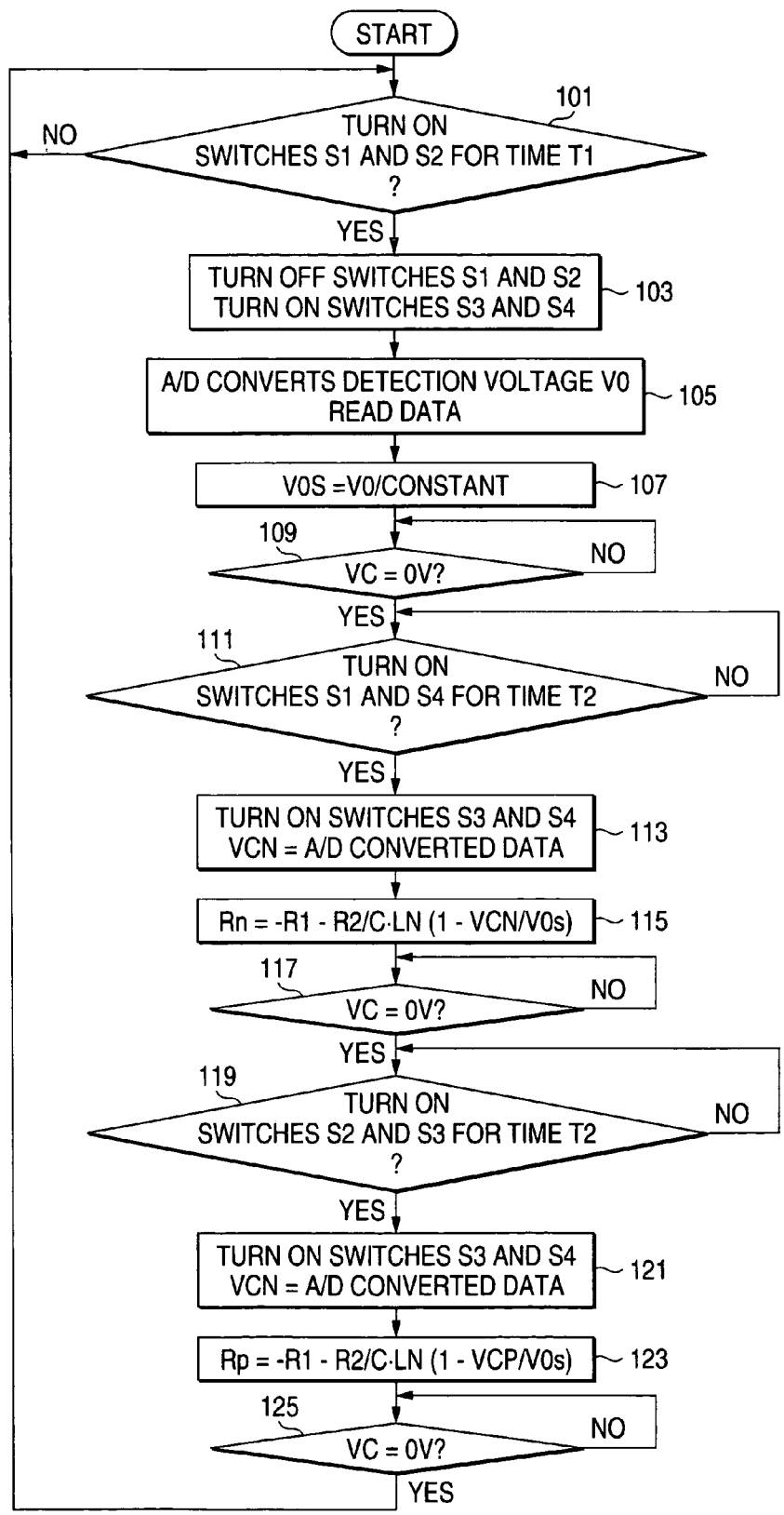
FIG. 2 is a flow chart showing a process of computing an insulation resistance of the non-grounded power source, which is carried out in the insulation detecting device.
Figure 3:
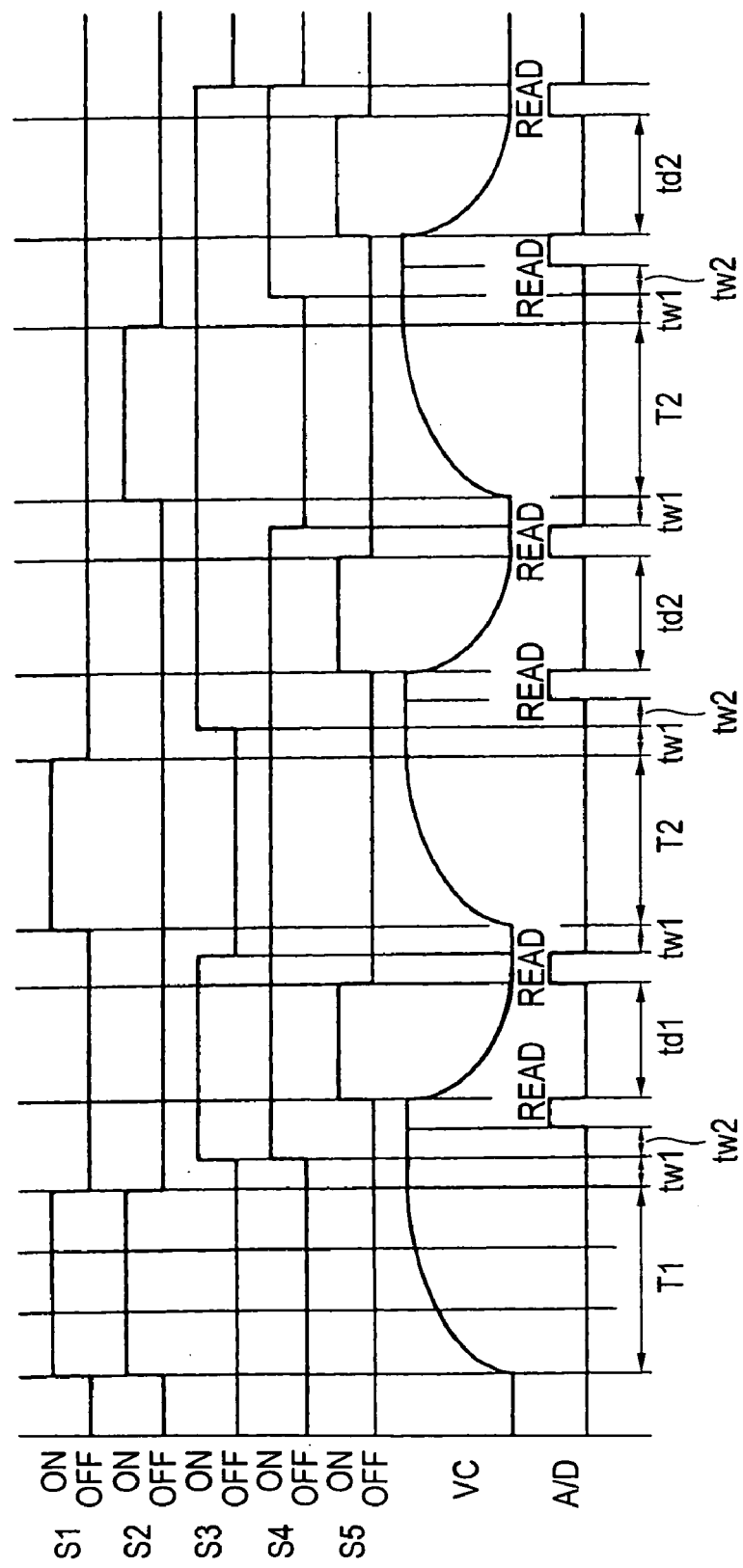
FIG. 3 is a timing chart showing operations of switching devices, charging and discharging operations of a capacitor and capacitor voltage readings.

Operation of the insulation detecting device according to the present invention will be described below. As shown in FIGS. 2 and 3, the insulation detecting device 1 starts an operation of detecting an insulation state of the main circuit wirings. In turn, the switching control circuit (not shown) turns on the first and second switches S1 and S2 for a first on time T1 as a first preset time (step 101). In other words, the first switching unit forms a circuit containing the capacitor 9, which is connected to the power source 3 without having a ground potential part. During the first on time T1, the capacitor 9 is charged and voltage across the capacitor 9 increases. The first on time T1 is shorter than a time taken till the capacitor 9 is completely charged. The first on time T1 is short, for example, ⅕ to ¹⁄₁₀ as large as the time taken to completely charge the capacitor. The first on time T1 is selected depending on a measurement error range of a necessary insulation resistance.

After the first on time T1 elapses in the step S101, the first and second switches S1 and S2 are turned off. After a preset time tw1 that is shorter than the first on time T1 is elapsed, the third and fourth switches S3 and S4 are turned on (step a103). In other words, the fourth switching unit forms a circuit containing the micro computer 11 for detecting voltage across the capacitor 9. The circuit is a discharge circuit which includes the capacitor 9, the second diode D2, the second resistor R2, the third switch S3, the third resistor R3, the fourth resistor R4, and the fourth switch S4. The capacitor 9 discharges through the discharge circuit and the voltage VC decreases. After a preset time Tw2 shorter than the first on time T1 elapses from the turning on of the third and fourth switches S3 and S4, the micro computer 11 reads A/D converted data, i.e., the voltage VC across the capacitor 9, through the A/D port (step 105). The micro computer 11 computes an estimated power source voltage V0s by using the following equation (1) (step 107)

$$V0=V0s(1-EXP(-T1/C\cdot R1)) \quad (1)$$

wherein V0=voltage VC across the capacitor 9, or detecting voltage;

T1=on time of the first and second switches S1 and S2;

C=capacitance of the capacitor 9;

R1=resistance of the first resistor R1.

After the voltage VC across the capacitor 9 is detected, the switching control circuit turns on the fifth switch S5 in a state that the third and fourth switches S3 and S4 are in an on state to by-pass the discharging current on the second resistor R2. As a result, resistance of the second resistor R2 is reduced, and hence, a discharging time of the capacitor 9 is reduced. After a preset time td1 which is shorter than the first on time T1, elapses from the turning on of the fifth switch S5, the fifth switch S5 is turned off, and the micro computer 11 reads A/D converted data, i.e., the voltage VC across the capacitor 9 (step 109).

After it is confirmed that the voltage VC=0V in a step 109, the switching control circuit (not shown) turns off the third switch S3, and then turns on the first switch S1 after a preset time tw1 elapses. The switching control circuit turns on the first switch S1 and the fourth switch S4 for a second on time T2 as a second preset time (step 111). Then, the second switching unit forms a series circuit including the capacitor 9 between the positive terminal of the power source 3 and the ground potential part 7. The series circuit, as shown in FIG. 1, includes the positive main circuit wiring 5a, the first switch S1, the first diode D1, the first resistor R1, the capacitor 9, the fourth switch S4, the fourth resistor R4, and the ground potential part 7. Further, the series circuit includes a negative terminal ground resistance Rn indicated by a dotted line in FIG. 1, the negative main circuit wiring 5b, and the negative terminal of the power source 3. With the formation of the series circuit, the capacitor 9 is charged during the second on time T2, and as shown in FIG. 3, the voltage VC across the capacitor 9 increases depending on a value of the negative terminal ground resistance Rn. The second on time T2, like the first on time T1, is selected to be shorter than the time required for completely charging the capacitor 9, but longer than the times tw1, tw2 and td1.

In a step 111, after the second on time T2 elapses, the first switch S1 is turned off, and after the time tw1 elapses, the third switch S3 is turned on, and at this time the third switch S3 and the fourth switch S4 are in an on state (see FIGS. 2 and 3). As a result, the fourth switching unit forms a circuit containing the micro computer 11 for detecting voltage across the capacitor 9. The circuit is a discharge circuit which includes the capacitor 9, the second resistor R2, the third resistor R3 and the fourth resistor R4. The capacitor 9 discharges through the discharge circuit and the voltage VC decreases. After a preset time Tw2 elapses from the turning on of the third switch S3, the micro computer 11 reads A/D converted data, i.e., the voltage VC across the capacitor 9, through the A/D port (step 113). The micro computer 11 computes an insulation resistance (i.e., a negative terminal ground resistance Rn) of the negative terminal of the power source 3 to the vehicle body or the like as the ground potential part 7, by using the following equation (2) (step 115)

$$Rn=-R1-T2/C\cdot In(1-VCN/V0s) \quad (2)$$

wherein VCN=voltage VC across the capacitor 9, i.e., detection voltage;

T2=on time of the first switch S1 and the fourth switch S4;

C=capacitance of the capacitor 9;

R1=resistance of the first resistor R1; and

V0s=power source voltage estimated in the step 107.

After the voltage VC across the capacitor 9 is detected in the step 115, the switching control circuit (not shown) turns on the fifth switch S5 in a state that the third and fourth switches S3 and S4 are in an on state. By the turning on of the fifth switch S5, the discharging current by-passes the resistor R2, so that the discharging time of the capacitor 9 is reduced. After a preset time td2 which is shorter than the second on time T2, elapses from the turning on of the fifth switch S5, the fifth switch S5 is turned off, and the micro computer 11 reads A/D converted data, i.e., the voltage VC across the capacitor 9 (step 117).

After it is confirmed that the voltage VC=0V in a step 117, the switching control circuit (not shown) turns off the fourth switch S4 and then turns on the second switch S2 after a preset time tw1 elapses. The switching control circuit turns on the second switch S2 and the third switch S3 for a second on time T2 as a second preset time (step 119). Then, the third switching unit forms a series circuit including the capacitor 9 between the ground potential part 7 and the negative terminal of the power source 3. The series circuit includes the positive main circuit wiring 5a, a positive terminal ground resistance Rp indicated by a dotted line, the ground potential part 7, the third resistor R3, the third switch S3, the first diode D1, the first resistor R1, the capacitor 9, the second switch S2, and the negative main circuit wiring 5b (see FIG. 1). With the formation of the series circuit, the capacitor 9 is charged during the second on time T2, and as shown in FIG. 3, the voltage VC across the capacitor 9 increases depending on a value of the positive terminal ground resistance Rp.

In the step 119, after the second on time T2 elapses, the second switch S2 is turned off, and after the time tw1 elapses, the fourth switch S4 is turned on, and in this state the third switch S3 and the fourth switch S4 are both in an on state (see FIGS. 2 and 3). As a result, the fourth switching unit forms a circuit containing the micro computer 11 for detecting voltage across the capacitor 9. The circuit is a discharge circuit which includes the capacitor 9, the second resistor R2, the third resistor R3 and the fourth resistor R4. The capacitor 9 discharges through the discharge circuit and the voltage VC decreases. After a preset time Tw2 elapses from the turning on of the fourth switch S4, the micro computer 11 reads A/D converted data, i.e., the voltage VC across the capacitor 9, through the A/D port (step 121). The micro computer 11 computes an insulation resistance (i.e., the positive terminal ground resistance Rp) of the positive terminal of the power source 3 to the vehicle body or the like as the ground potential part 7, by using the following equation (3) (step 123)

$$Rp=-R1-T2/C\cdot In(1-VCP/V0s) \quad (3)$$

wherein VCP=voltage VC across the capacitor 9, i.e., detection voltage;

T2=on time of the second switch S2 and the third switch S3;

C=capacitance of the capacitor 9;

R1=resistance of the first resistor R1; and

V0s=power source voltage estimated in the step 107.

After the voltage VC across the capacitor 9 is detected in the step 123, the switching control circuit, not shown, turns on the fifth switch S5 in a state that the third and fourth switches S3 and S4 are in an on state. By the turning on of the fifth switch S5, the discharging current by-passes the resistor R2, so that the discharging time of the capacitor 9 is reduced. After a preset time td2 which is shorter than the second on time T2, elapses from the turning on of the fifth switch S5, the fifth switch S5 is turned off, and the micro computer 11 reads A/D converted data, i.e., the voltage VC across the capacitor 9 (step 125). After it is confirmed that the voltage VC=0V in a step 125, a first cycle of detecting an insulation state ends. While the insulation state detection is continued, the insulation-state detection cycle from the step 101 to the step 125 is repeated.

The micro computer 11 judges an insulation state of the main circuit wirings from the positive terminal ground resistance Rp and the negative terminal ground resistance Rn of the power source 3, which are obtained through one insulation-state detecting cycle. Specifically, the micro computer 11 compares the positive terminal ground resistance Rp of the power source 3 with a predetermined reference value. If the ground resistance Rp is equal to or lower than the predetermined reference value, the micro computer 11 decides that a line-to-ground fault is present.

As seen from the formulae (2) and (3), where the capacitance C of the capacitor 9 and the resistance R1 of the first resistor R1 vary in value among capacitor products and with a variation of temperature, the capacitance and the resistance value variations adversely affect an accuracy of measuring the positive terminal ground resistance Rp and the negative terminal ground resistance Rn. The accuracy of the measured values of those ground resistance Rp and Rn of the power source 3 is deteriorated. And hence, the accuracy of detecting the insulation state is deteriorated. In particular, in the case of the capacitor 9, its capacitance is relatively large, several μF, when considering a stray capacitance. It is supposed that a variation in the capacitance value among the capacitor products is about ±5%. Since the capacitance value variation by the temperature variation is inevitably present, a total variation in the capacitance value is about ±10%. Such a capacitance value variation of the capacitor 9 deteriorates the accuracy of detecting the insulation state. Additionally, a capacitance value variation of the capacitor, caused by a change of the part constant also deteriorates the accuracy of detecting the insulation state.

In this connection, the insulation detecting device 1 of the present invention turns on the first switch S1 and the second switch S2 for the first on time T1, which is shorter than the time taken to completely charge the capacitor 9, at an initial stage of the insulation detecting cycle, to thereby estimate a voltage of the power source 3. When the first switch S1 and the second switch S2 are tuned on for a short time to charge the capacitor 9, the power source voltage V0s is estimated by computing a voltage charged at a rate defined by a time constant C·R1 of the capacitance C of the capacitor 9 and resistance R1 of the first resistor R1. The power source voltage V0s contains errors, or variations, of the capacitance value and the resistance value of the capacitor 9 and the first resistor R1, and hence not an actual power source voltage of the power source 3. The power source voltage V0s containing those variations is used for the computations of the positive terminal ground resistance Rp and the negative terminal ground resistance Rn, which are carried out in the steps 115 and 123, whereby the capacitance and resistance variations of the capacitor 9 and the first resistor R1 are corrected. The correction of those variations reduce an error between the actual positive and negative terminal ground resistances Rp and Rn, and an error between the actual positive and negative terminal ground resistances Rp and Rn. As a result, the accuracy of detecting the insulation state is enhanced.

Figure 4:
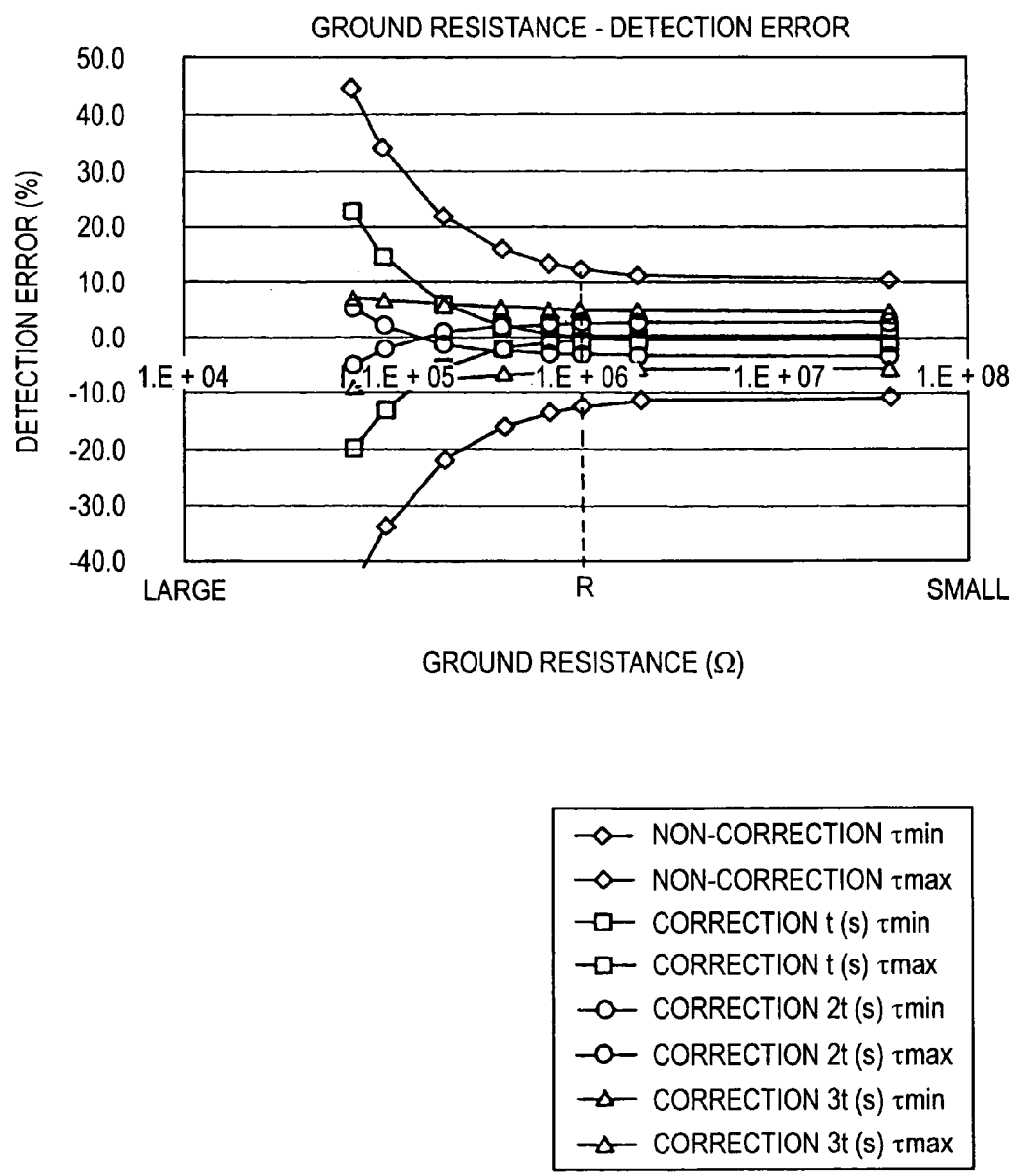
FIG. 4 is a graph comparatively showing variations of detection errors with respect to ground or insulation resistance with the power source voltage measuring times as parameters.

The errors between the positive and negative terminal ground resistances Rp and Rn measured by the insulation detecting device 1 of the instant embodiment, and between the actual positive and negative terminal ground resistances Rp and Rn were computed. The insulation detecting device 1 used for the measurement used the capacitor 9 having a prescribed capacitance, and the first resistor R1 having a prescribed resistance. It was supposed that the capacitor 9 had a capacitance variation of about ±10% and the first resistor R1 had a resistance variation of about ±2%, allowing for those variations among the capacitor and resistance products and by the temperature variation. The results of the computations are shown in FIG. 4. In FIG. 4, the V0 (detecting voltage) measuring time is the first on time T1. In FIG. 4, measurement errors are plotted at three first on times T1; T1=t, T1=2t, and T1=3t, where t<2t<3t. In FIG. 4, the ordinate of the graph represents a detection accuracy or detection error, and the abscissa represents the ground resistance.

As seen from FIG. 4, when the voltage across the capacitor 9 is measured by using the insulation detecting device 1 of the embodiment, viz., the variations of the part constants are corrected, the measurement errors are more reduced with respect to the ground resistance than those when the capacitor voltage is measured by using the related insulation detecting device, viz., the variations of the part constants are not corrected. Further, a degree of the measurement error reduction varies depending on the V0 measuring time, i.e., the first on time T1. More exactly, when the first on time T1=t sec., as the ground resistance becomes smaller, the error becomes larger, and as the ground resistance becomes larger, the error becomes smaller. When T1=2t sec., in a region where the ground resistance is large, the error is larger than that when T1=t sec., but the error is small in average over the entire range of the ground resistance values. Also when T1=3t sec., the error is small in average over the entire range of the ground resistance values, but it is larger than that when T1=2t sec.

When the ground resistance value used for judging the insulation failure is set to be relatively large, it is preferable to use T1=t. When the ground resistance value used for judging the insulation failure is set to be relatively small, T1=2t is preferable. Thus, it is preferable to select the first on time T1, or the first preset time, such that the measurement error becomes small at values near the ground resistance value used for judging the insulation failure. For example, if the ground resistance value used for judging the insulation failure is R Ω in FIG. 4, it is preferable to use T1=2t. If so selected, the measurement error is ±2% or smaller when the insulation detecting device 1 of the embodiment is used, while it is ±10% or larger when the related insulation detecting device is used. From those figures, it is clearly seen that the detection accuracy of the insulation state is considerably enhanced.

Further, the insulation detecting device 1 is capable of lessening the adverse effects of the variations of the part constants, such as the capacitance of the capacitor 9, on the insulation state detection. This fact implies that there is no necessity of using the circuit parts having less variation in the part constant value among the products, viz., parts of high quantity and accuracy, and that increase of the cost to improve the insulation detection accuracy is lessened.

Furthermore, the insulation detecting device 1 includes a by-passing member, including the fifth switch S5, for by-passing the second resistor R2 when it is turned on or closed. With provision of the fifth switch S5, the discharging time of the capacitor 9 is reduced by closing the fifth switch S5 after the micro computer 11 detects the voltage across the capacitor 9. Consequently, the time taken for one cycle of the insulation detecting operation is reduced, the number of insulation detecting operations per unit time is increased, and the insulation detection accuracy is further improved.

Figure 5:
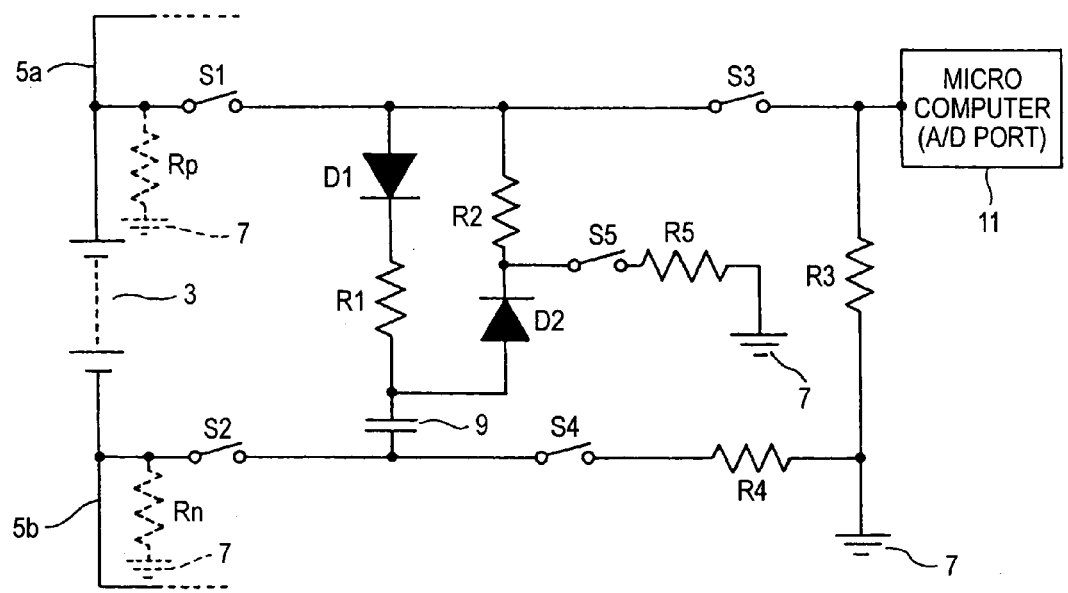
FIG. 5 is a circuit diagram showing a modification of the insulation detecting device which is the embodiment of the invention.

The by-passing member may also be constructed as shown in FIG. 5. In the circuit illustrated, the by-passing member is realized by a series circuit including the fifth switch S5 and a fifth resistor R5 lower than the second resistor R2 in resistance. The series circuit is connected to a node between the second diode D2 and the second resistor R2. Also, in a case where there is no need of reducing the time taken for one cycle of the insulation detecting operation, the by-passing member including the fifth switch S5 and the like may be omitted.

The embodiment of the present invention is also capable of locating an insulation failure by individually computing the positive terminal ground resistance Rp and the negative terminal ground resistance Rn. To detect only the occurrence of the insulation failure without locating the insulation failure, another formula may be used which computes, for example, a ground resistance value representative of the positive terminal ground resistance Rp and the negative terminal ground resistance Rn by using the estimated power source voltage V0s, and the detection voltages VCP and VCN.

It will be understood that the invention may be applied to the insulation detecting devices having various circuit arrangements if those devices includes at least the following switching unit: a first switching unit for connecting a capacitor to a DC power source insulated from a ground potential part though positive and negative wirings, which are respectively coupled to a positive terminal and a negative terminal of the DC power source for a first preset time; a second switching unit for connecting the capacitor between the positive terminal of the DC power source and the ground potential part for a second preset time; a third switching unit for connecting the capacitor between the negative terminal of the DC power source and the ground potential part for the second preset time; and a fourth switching unit for connecting detecting units for detecting a voltage across the capacitor after the first to third switching units are turned off.

Although the present invention has been shown and described with reference to specific preferred embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An insulation detecting device for a non-grounded power source, comprising:
   a capacitor;
   a DC power source, insulated from a ground potential part;
   a voltage detecting unit, detecting a voltage across the capacitor;
   a first switching unit, connecting the capacitor to the DC power source in series for a first preset time shorter than a time taken for completely charging the capacitor;
   a second switching unit, connecting the capacitor between a positive terminal of the DC power source and the ground potential part in series for a second preset time;
   a third switching unit, connecting the capacitor between a negative terminal of the DC power source and the ground potential part in series for the second preset time;
   a fourth switching unit, connecting the voltage detecting unit to the capacitor after the first to third switching units are turned off; and
   a computing unit, estimating a voltage across the power source based on a detection voltage that is detected by the voltage detecting unit after the first switching unit is turned off, and computing insulation resistances of the power source to the ground potential part based on the estimated voltage and each detection voltage that is detected by the voltage detecting unit after either of the second and third switching unit is turned off.

2. The insulation detecting device as set forth in claim 1, wherein the first switching unit includes a first switch device connected to the positive terminal of the power source and a second switch device connected to the negative terminal of the power source;
   wherein the third switching unit includes the second switch device and a third switch device connected in series to the first switch device;
   wherein the second switching unit includes the first switch device and a fourth switch device connected in series to the second switch device;
   wherein the fourth switching unit includes the third switch device and the fourth switch device;
   wherein a first series circuit including a first diode, a first resistor and the capacitor are connected between a node between the first switch device and the third switch device and a node between the second switch device and the fourth switch device, an anode of the first diode being connected to the first switch device;
   wherein a second series circuit including a second diode and a second resistor is connected in parallel to the first diode and the first resistor of the first series circuit, an anode of the second diode being connected to a node between the first resistor and the capacitor;
   wherein the voltage detecting unit is connected between the third switch device and the fourth switch device; and
   wherein the ground potential part is connected between the voltage detecting unit and the fourth switch device.

3. The insulation detecting device as set forth in claim 2, further comprising a by-passing unit including a fifth switch device which forms a by-passing path of the second resistor when the fifth switch is turned on.

* * * * *